United States Patent [19]

Rodbell et al.

[11] Patent Number: 5,071,714

[45] Date of Patent: Dec. 10, 1991

[54] MULTILAYERED INTERMETALLIC CONNECTION FOR SEMICONDUCTOR DEVICES

[75] Inventors: Kenneth P. Rodbell; Paul A. Totta, both of Poughkeepsie; James F. White, Newburgh, all of N.Y.

[73] Assignee: International Business Machines Corporation, Armonk, N.Y.

[21] Appl. No.: 339,533

[22] Filed: Apr. 17, 1989

[51] Int. Cl.$^5$ .................... B32B 15/20; C23C 14/16; C23C 14/34

[52] U.S. Cl. .................................. 428/620; 428/651; 204/192.17; 357/71

[58] Field of Search ............... 428/651, 660, 661, 620, 428/610; 357/71; 204/192.15, 192.17

[56] References Cited

U.S. PATENT DOCUMENTS

| | | | |
|---|---|---|---|
| 4,017,890 | 4/1977 | Howard et al. | 357/67 |
| 4,612,257 | 9/1986 | Broadbent | 428/651 |
| 4,673,623 | 6/1987 | Gardner et al. | 428/651 |

OTHER PUBLICATIONS

IBM Technical Disclosure Bulletin, vol. 21, No. 11, Apr. 1979, "Sputtered Metallurgy Process for Electromigration Improvement of Al–Cu" by P. S. Ho et al, pp. 4527–4528.
IBM Technical Disclosure Bulletin, vol. 27, No. 1A, Jun. 1984, "Elimination of Microblisters in Aluminum Metallurgy Systems Employing a Cr–Cr2O3 Underlying Layer", by J. J. Gajda et al., p. 343.
IBM Technical Disclosure Bulletin, vol. 21, No. 2, Jul. 1978, "Thin Film Metallurgy with Sandwich Barrier Layer", by A. Brouillard et al., p. 576.
IEEE V-MiC Conf., Jun. 25-26, 1985 "Homogeneous and Layered Films of Aluminum/Silicon with Titanium for Multilevel Interconnects" by D. S. Gardner et al., pp. 102-113.
MRS Symposia Proceedings, Fall, 1987, "Multilayered Interconnections for VLSI" by D. S. Gardner et al, pp. (1 of 12 through 12 of 12).
IBM Technical Disclosure Bulletin, vol. 13, No. 5, Oct. 1970, by J. J. Gniewek et al., "Titanium Overlay on Metallurgy", p. 1124.
J. Appl. Phys. 49(7), Jul. 1978, "Intermetallic Compounds of Al and Transitions Metals: Effect of Electromigration in 1-2-$\mu$M-Wide Lines", pp. 4083–4093.
Proceedings of Int'l Congress of Metallic Corrosion, Toronto, Jun. 1984, "Corrosion Behavior of Al–Cu Alloy Thin Films in Microelectronics" by J. Zahavi, M. Rotel, H. C. W. Hwang and P. A. Totta.

Primary Examiner—John J. Zimmerman
Attorney, Agent, or Firm—Jeffrey L. Brandt; Alexander Tognino

[57] ABSTRACT

A sputtered low copper concentration multilayered, device interconnect metallurgy structure is disclosed herein. The interconnect metallization structure comprises a sputtered aluminum-copper (<2) weight percent copper conductor. In the preferred embodiment, the AlCu conductor has formed on one or both of its surfaces a layer of an intermetallic compound formed from a Group IVA metal and aluminum. The Group IVA metal is deposited by sputtering. Optionally, onto said top intermetallic layer is further deposited a non-reflective, non-corrosive, etch-stop, capping layer.

16 Claims, 4 Drawing Sheets

MULTILAYERED INTERMETALLIC CONNECTION FOR SEMICONDUCTOR DEVICES

BACKGROUND OF THE INVENTION

1. Field of the Invention

This invention relates to the device structure for the interconnection of semiconductor devices on a substrate and more particularly to a multilayered sputtered interconnect metallurgy structure which structure includes a low percent copper content aluminum/copper conductor.

2. Description of Related Art

Thin narrow interconnections have been used for some years for device interconnection purposes in the semiconductor integrated circuit industry. It is predicted that performance of these devices in the future will be limited by the performance of the device interconnection at the submicron level. At the submicron level, various technical problems are known to occur. While aluminum has been the preferred interconnection metal, as device dimensions are scaled down and current density increases, pure aluminum has been known to be susceptible to the problems of electromigration and hillock growth. To overcome the problems experienced with pure aluminum, aluminum has been alloyed with copper to form aluminum-copper. However, high percentage aluminum-copper ($>2\%$) is known to be difficult to dry etch and corrodes easily.

In an effort to improve on the use of aluminum-copper as the interconnection metallurgy, aluminum-copper has been taught to be layered with a refractory metal (i.e., U.S. Pat. No. 4,017,890). This patent teaches a method and resulting structure for forming narrow intermetallic stripes which carry high currents on bodies such as semiconductors, integrated circuits, etc., wherein the conductive stripe includes aluminum or aluminum-copper with at least one transition metal. While the aluminum-copper and transition metal structure has been known to improve the electromigration problems associated with aluminum-copper, the problems of etching and corrosion, as well as, the complete elimination of hillocks have not been solved.

As known in the art, hillocks are known to result from the large differences between the thermal expansion coefficients of the metal interconnect lines and the substrate. To eliminate and minimize hillock formation, it has been known in the art to use a multilayered structure instead of a single layer of the interconnect metallurgy. An effective reduction in hillock formation has been found to be achieved by using a multilayered structure of aluminum or aluminum intermetallic with a layer of refractory metal. Wherefore, a typical interconnect metallurgy structure would comprise a layered structure of aluminum silicon compound onto which there has been deposited, a layer of refractory metal, such as, titanium (see article "Homogeneous and Layered Films of Aluminum/Silicon with Titanium For Multilevel Interconnects", 1988 IEEE, V-MIC Conference, June 25-26, 1985).

There have also been refinements to this layered metal structure to provide a lower resistivity, hillock free, interconnect metallurgy. These refinements include the incorporation of a barrier metal of, for example, titanium tungsten or titanium nitride under the aluminum silicon to prevent contact spiking and prevent the formation of ternary compounds in the aluminum silicon alloy (see article "Multilayered Interconnections For VLSI" MRS Symposia Proceedings, Fall, 1987).

In addition, in this area, there have also been other proposed device interconnect structures to reduce resistivity and provide a more planar and defect free interconnect structure.

For example, IBM Technical Disclosure Bulletin, Vol. 21, No. 11, April, 1979, pp. 4527–4528, teaches the enhancement of the metallurgy for the interconnection due to sputtered deposition. Moreover, the feature of using a capping layer to improve performance has been proposed in IBM TDB Vol. 17, No. 1A, 1984 and TDB Vol. 21, No. 2, July 1978. However, no structure has been discovered which can satisfy all performance criteria providing a low resistance, hillock free, corrosion resistant, etchable, interconnection metallurgy structure.

It is, therefore, an object of the present invention to provide sputtered low weight percent copper ($<2\%$) content aluminum/copper conductor for device interconnection on a substrate with superior electromigration characteristics.

It is a still further object of the present invention to develop a multilayered interconnect metallurgy structure that is hillock free, dry etchable and corrosion resistant.

It is another object of the present invention to provide a multilayered interconnect metallurgy structure which has a low resistivity.

SUMMARY OF THE INVENTION

A sputtered low-copper concentration multilayered, device interconnect metallurgy structure is disclosed herein. The interconnect metallization structure comprises a sputtered aluminum-copper ($<2$) weight percent copper conductor. In the preferred embodiment, the conductor layer is formed with a top and bottom layer of an intermetallic, said intermetallic also being sputtered and being of a thickness of approximately 700 Å. Onto said intermetallic layer is further deposited an etch stop, and non-corrosive, protective capping layer.

DESCRIPTION OF THE PREFERRED EMBODIMENTS

Figure 1:
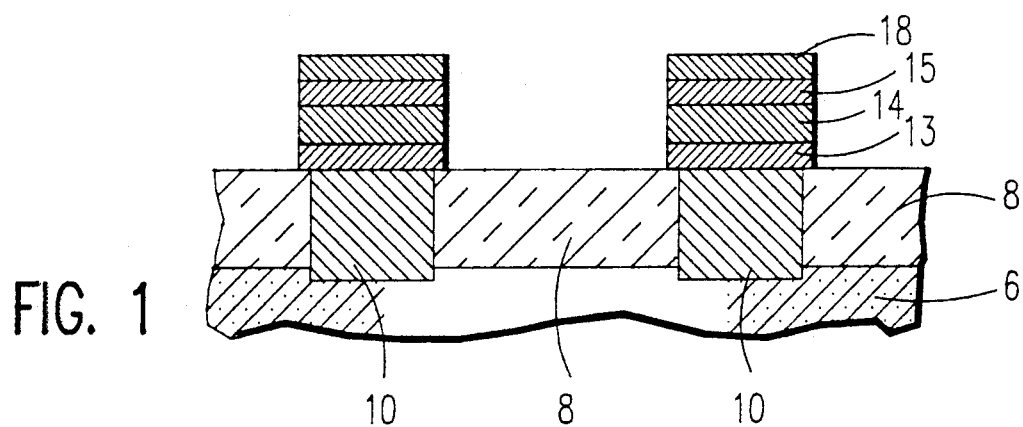
FIG. 1 is a cross-sectional view of the preferred embodiment of an interconnect metallurgy according to the subject invention.

FIG. 1 is a cross-sectional view of the preferred embodiment of an interconnect metallurgy structure according to the subject invention. FIG. 1 represents the interconnect structure after being processed through final annealing.

Referring to FIG. 1, the interconnect metallurgy is seen to comprise a four-layer structure over an interplanar stud connection 10 surrounded by an insulator 8 to make connection to a device substrate 6. The four-layer structure consists of a bottom-sputtered layer 13 of an intermetallic formed by the reaction between the conductor layer 14 and pre-annealed surface layer 12 (see FIGS. 2-7). The layer 13 is typically 700 Å thick and in a preferred embodiment would comprise $TiAl_3$. Onto said sputtered intermetallic layer 13 is a sputter-deposited, low percent (<2) weight percent copper, aluminum-copper, conductor layer 14. After annealing, the layer 14 is typically 8,500 Å thick and consists of a composition of 99.5% aluminum and 0.5% copper (aluminum-0.5% copper hereafter). On layer 14 is a second intermetallic layer 15 of the same thickness and composition as the layer 13. A layer 18 of aluminum-0.5% copper or pure aluminum of approximately 100 Å to 500 Å thick is then sputter deposited to cap the structure. While this completes the structure for a single interconnect layer according to the subject invention, it should be recognized by those skilled in the art that said layers can then be repeated in a multiple level sequence to complete the interconnect circuit for the devices.

Figure 2:
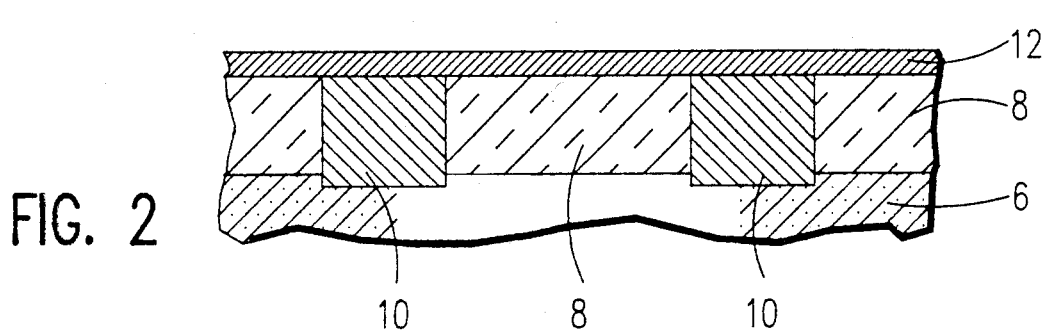
FIGS. 2 through 8 are cross-sectional views of the process for building the preferred interconnect metallurgy of the subject invention in a step-by-step fashion.

Referring now to FIG. 2, FIG. 2 shows a planar insulator 8 and contact stud 10 with a Group IVA metal layer 12 sputter deposited thereon. The layer 12 is deposited by the following process. After formation of the device contact metallization 10, the semiconductor wafer would be loaded into a sputtering tool which has been pumped to a low pressure. An in-situ sputter clean is then performed to remove any oxide from the contact metal 10 formation on the wafer at this time. This in-situ sputter clean typically is a mild sputter clean, run, for example, at about five minutes at low power (approximately 1,000 watt) in a high-pressure argon ambient.

Following the sputter cleaning, the first level of metallization 12 is then deposited. This first level metallization 12 is comprised of a Group IVA metal, preferably titanium, deposited on the device contact metallization 10 of the wafer in a blanket formation. This layer 12 is deposited at low power in a high pressure, high purity, argon plasma from an ultra-pure titanium target at a rate of about 60 Å per minute. Preferably, the titanium is deposited to a thickness of approximately 250 Å.

Figure 3:
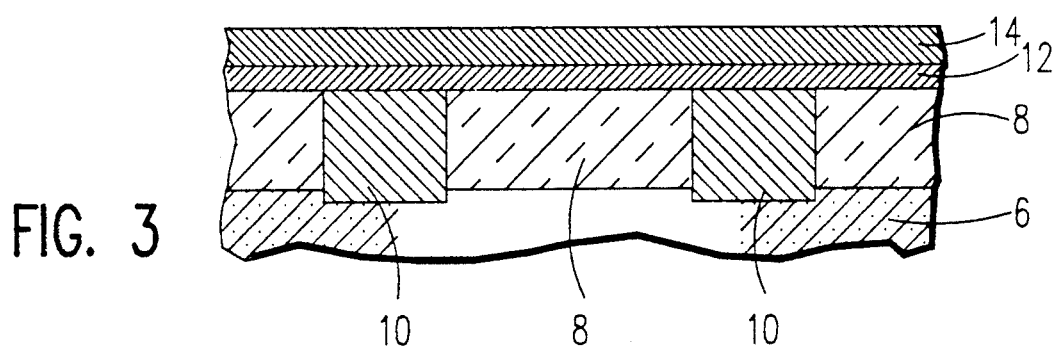

Referring now to FIG. 3, following the deposition of the layer 12, the interconnect metallization layer 14 is next blanket deposited. The interconnect metallization 14 is preferably aluminum-0.5% copper (approximately 9,500 Å thick). The aluminum-copper is deposited at high power using a direct current magnetron in a high purity argon plasma from an ultra-pure pre-alloyed target typically aluminum-0.5 weight percent copper with a deposition rate of about 1,500 Å per minute.

Figure 4:
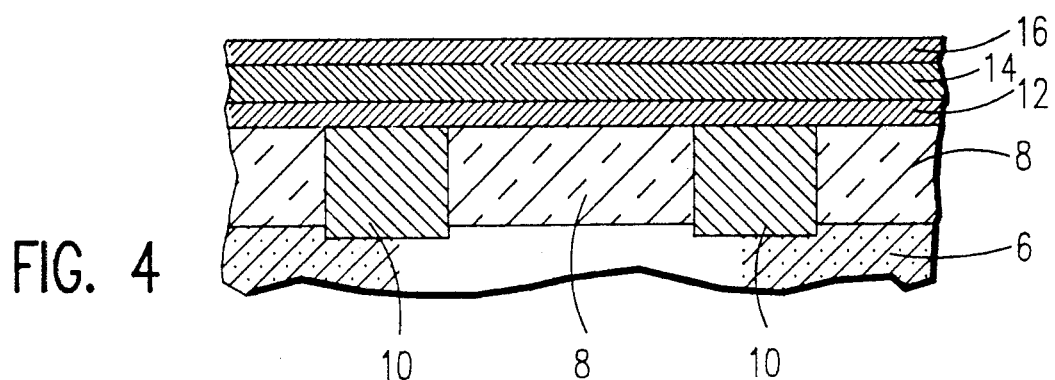

Onto said aluminum-copper interconnect metallization 14 is then deposited 250 Å of a Group IVA metal similar to the previously deposited metal layer 12 discussed above. Deposition, composition and thickness of said layer 16 is identical to the previously deposited layer 12 (FIG. 4).

Figure 5:
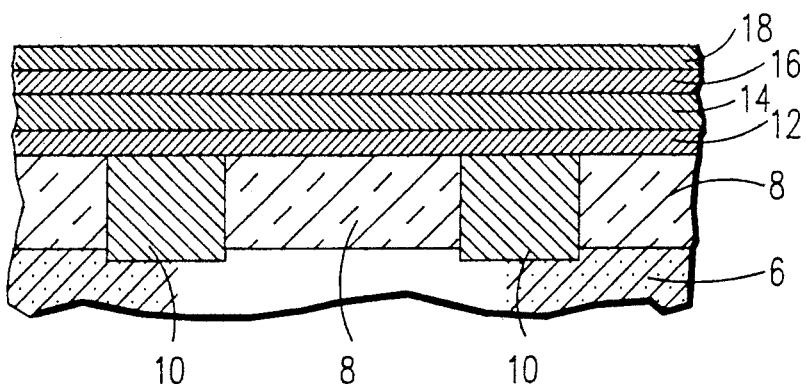

From FIG. 5, onto said metal layer 16 is then blanket deposited a suitable capping layer 18 to complete the interconnect metallurgy at this level. The capping layer 18 is preferably comprised of aluminum-0.05% copper deposited in the same manner as the conductor aluminum-0.05% copper layer 14 as discussed above. The purpose of this layer is to: 1) prevent over-etch of metal layer 16; 2) limit the amount of light reflection during the subsequent photoresist steps, and 3) to act as a protective layer against corrosion during subsequent processing. Therefore, any layer which would similarly satisfy the requirements of reducing the amount of light reflection and provide protective anodic capping during subsequent processing would be usable for this layer (e.g. pure aluminum).

Figure 6:
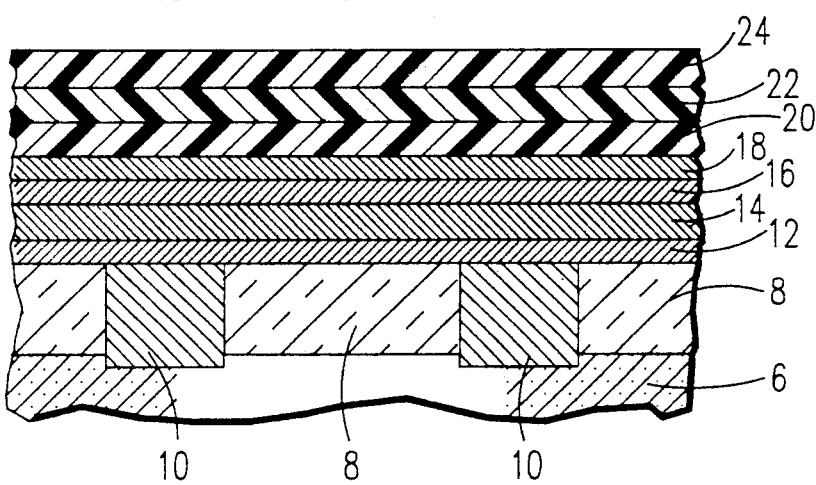

Referring now to FIG. 6, on top of metallization 18, a multilayered photoresist (20, 22 and 24) is then applied to pattern this blanket interconnect metallization. Any number of different photoresist techniques can be used. In particular, multilayered photoresists are well suited for this purpose, as well as, single-layered resists.

With a multilayered resist as shown in FIG. 6, a first resist 20 is applied to a thickness of approximately 1.8 micrometers. In the preferred embodiment this resist is a diazo-quinone novolak photoresist. The resist 20 is baked in an oven in a nitrogen ambient at about 200° C. for 30 minutes. This resist 20 serves as a sacrificial layer during subsequent metal reactive ion etching (RIE).

Onto said resist 20 is then deposited 200 Å of a silylating agent 22, such as, HMDS (hexamethyldisilizane). The HMDS 22 serves as a barrier to the oxygen reactive ion etching which is used to pattern the imaging layer resist 24.

Onto said HMDS layer 22 is next deposited an imaging layer resist 24 to a thickness of about 0.9-1.2 micrometers. Similar to resist 20, imaging resist 24 is a diazo-quinone novolak positive photoresist. The HMDS 22 and imaging resist layer 24 are then baked on a hot plate for 25 minutes at 85° C.

The imaging layer resist 24 is then exposed for the specific time required when used in conjunction with a specific exposure tool and associated mask. The exposed image is developed using conventional developing for the required time depending on the exposure. The wafer is then rinsed and dried and the patterned top imaging layer is UV hardened by exposing it to ultraviolet light for a specific period of time, typically, 5 to 10 minutes.

Following the patterning of the top imaging resist 24, the HMDS 22 and resist layer 20 are ready to be removed to expose the metal. The HMDS 22 and the resist 20 are removed by reactive ion etching. This is accomplished by loading the wafer into a plasma tool and exposing the wafer to a plasma reactive to the HMDS layer 22 (e.g. $CF_4$) and then to a different plasma (e.g. $O_2$) reactive to resist 20. The polymer residues of the remains of the HMDS layer 22 and the resist 20 are then removed by dipping in a solution of a conventional cleaning etch solution. This reactive ion etching of the HMDS layer 22 and the resist 20, has put a lithographic mask into place for the subsequent reactive ion etching of the underlying blanket metal layers.

The metallurgy can now be reactively ion etched in a multi-step sequence. The first step is to break through any oxides which may exist on the top surface of the metallization. Next, most of the metal is removed by reactive ion etching. An over etch is, then, performed to insure that all of the metal in the previous step has been etched away. Finally, a passivation step is performed to prevent any metal corrosion.

The reactive ion etch is typically performed in a single wafer tool under a low pressure. Typical plasma composition, pressure, power and time combinations, for performing the above etches in a step-by-step process can be seen from the following Table I. These compositions, pressures, powers and times should be recognized by those skilled in the art as being designed for a specific tool under specific conditions. Any comparable times, compositions, pressure, etc., could be similarly fabricated to insure the etch of the blanket metallization.

TABLE I

| | Gas Flow (cc/min) | | | |
|---|---|---|---|---|
| | Step 1 | Step 2 | Step 3 | Exit |
| $BCl_3$ | 20 | 12 | 12 | — |
| $Cl_2$ | 11 | 11 | 8 | — |
| $CHCl_3$ | 5 | 16 | 16 | — |
| $N_2$ | 50 | 50 | 50 | — |
| $CF_4$ | — | — | — | 180 |
| $O_2$ | — | — | — | 20 |
| Pressure (milli-Torr) | 375 | 375 | 375 | 0.5 Torr |
| Power (Watts) | 485 | 350 | 350 | 130 |
| Typical Times | 15 sec | 2-3 min | 40 sec | 20 sec |

With the completion of the reactive ion etch, the wafer can then be rinsed and dried.

Figure 7:
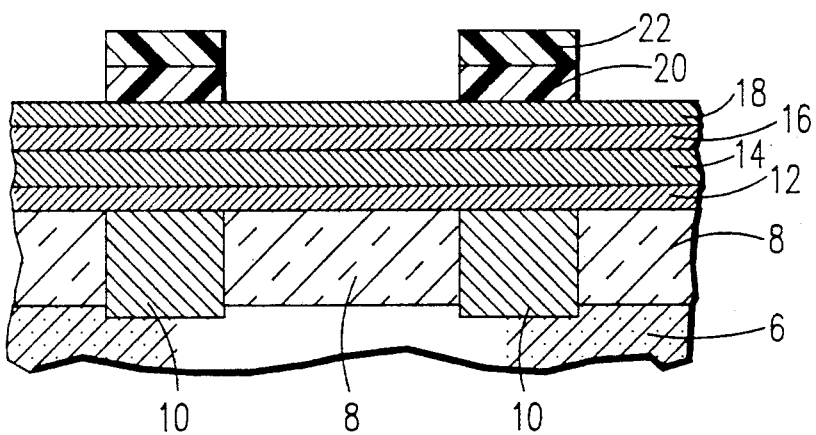

Referring now to FIG. 7, it can be seen that the reactive ion etch of the metal removes any of the remaining imaging layer resist 24 and most of the HMDS layer 22 leaving on the surface of the metal the resist 20. This resist 20 can be removed by placing the wafer in an oxygen plasma for approximately 45 minutes. The wafer is then placed in a developer at room temperature for a short period of time to remove any oxides that may have formed in the previous step. The wafer is again rinsed and dried.

Figure 8:
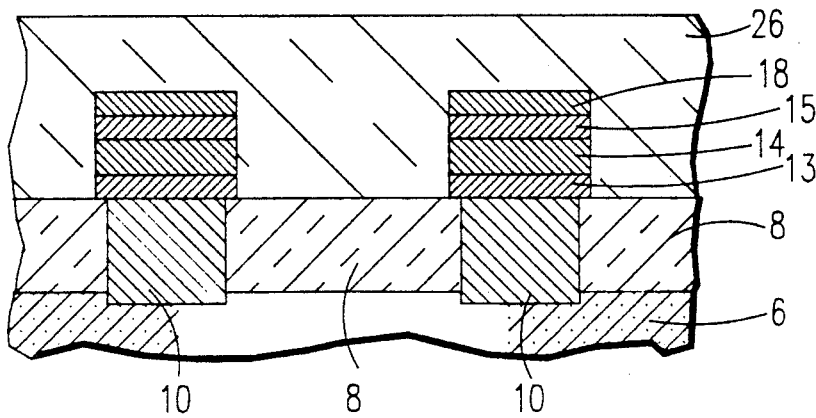

With removal of this final layer of the resist 20, the metallization stack can now be annealed by placing the wafer in an oven at 400° C. in forming gas for 1 hour in order to form $TiAl_3$ intermetallic layers 13 and 15 (as shown in FIGS. 1 and 8) on the top and the bottom of the aluminum-copper layer 14 and to allow grain growth to occur in the aluminum-copper layer 14.

From FIG. 8, it can be seen that once the metallization stack has been annealed (to the structure of FIG. 1) a suitable insulator 26 (e.g., planar quartz or plasma-enhanced CVD oxide or an organic insulator such as polyimide) can be blanket deposited over the multilayered interconnect structure. This insulator 26 can then be planarized and/or patterned for stud connection to the repeating interconnect layers deposited onto the base interconnect layer.

Figure 9:
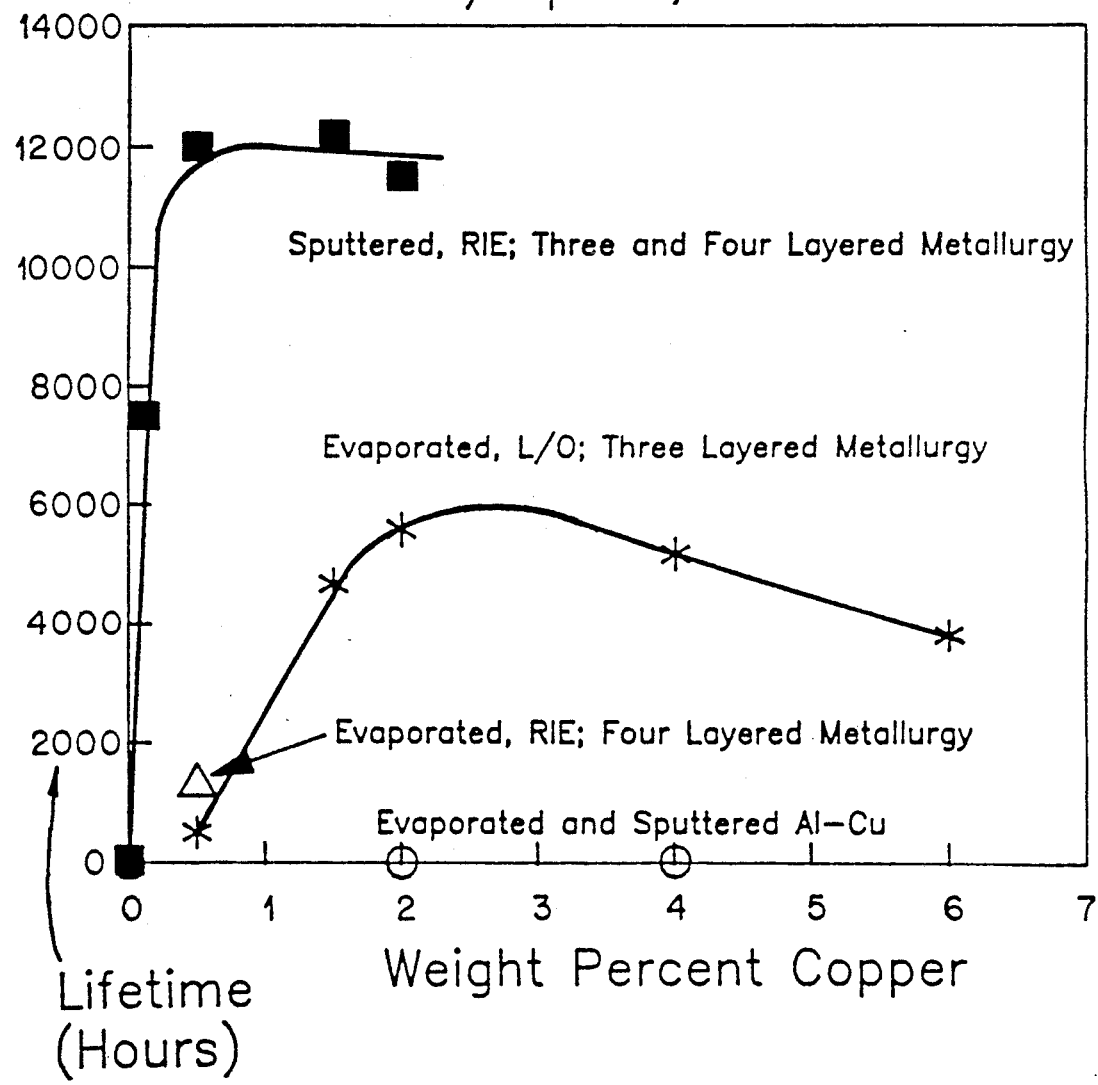
FIG. 9 is a graph of the lifetime (hours) versus weight percent copper for interconnect metalluries of the subject invention as compared to prior art interconnect metallizations.

The superior performance of the interconnect metallurgy of the subject invention over that which is known in the prior art can be seen in the following figures. FIG. 9 is a lifetime (hours) versus weight percent copper graph for the electromigration characteristics of both the above-described sputtered four-layered structure and an alternative sputtered three-layer structure (Al/Cu/refractory metal/Al-Cu), as compared to an evaporated three-layer structure patterned by lift-off and an evaporated four-layer structure, patterned by RIE. From FIG. 9 it can be seen that for all weight percent copper compositions, the sputtered interconnect metallurgies are vastly superior to the evaporated metallurgies.

Figure 10:
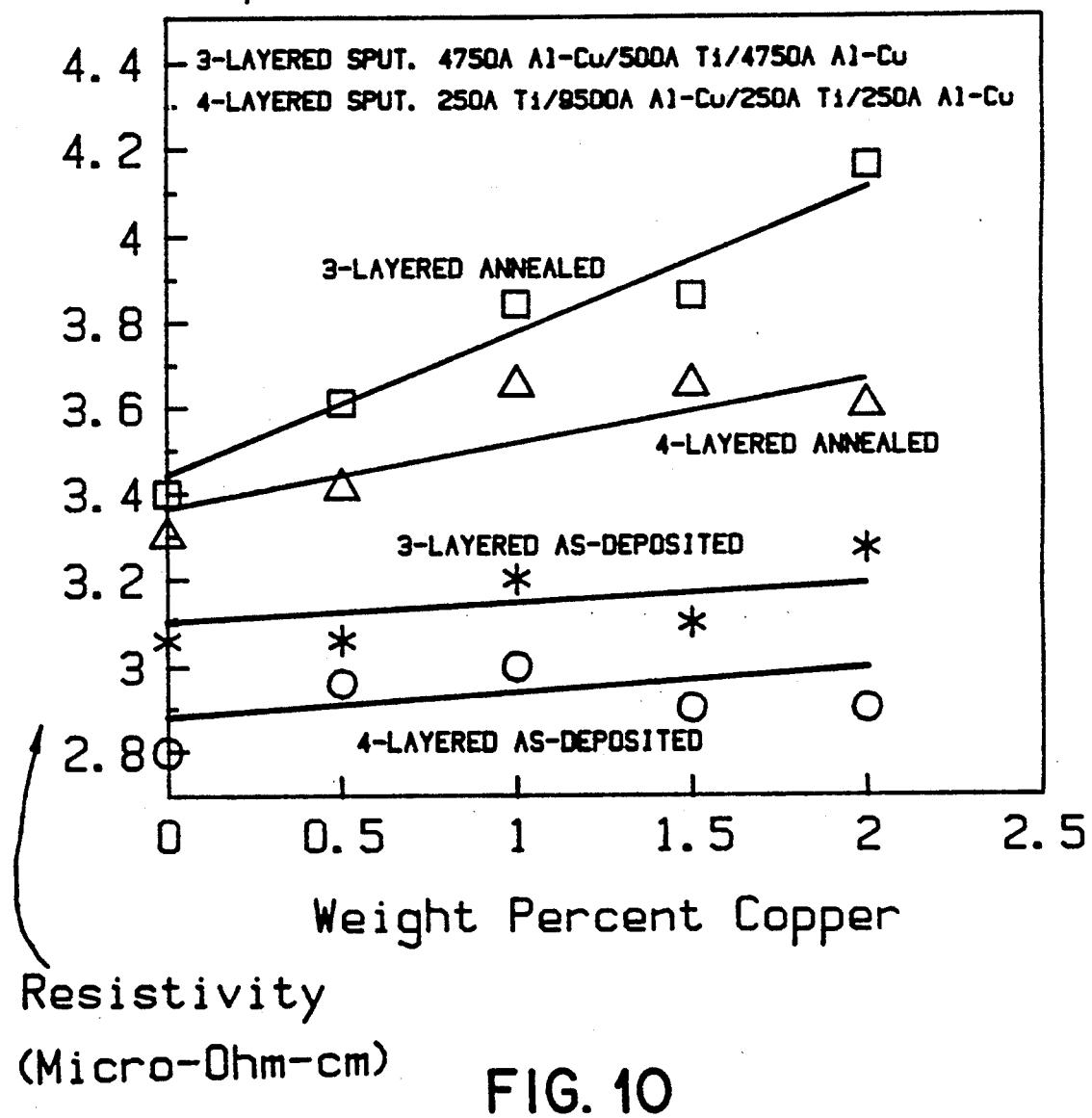
FIG. 10 is a graph of the resistivity versus weight percent copper for various alternative embodiment metallurgies of the subject invention before and after anneal.

FIG. 10 is a graph of the resistivity versus weight percent copper for various alternative embodiment metallurgies of the subject invention. The metallurgies have been subjected to a 400° C. forming gas anneal wherein the plots have been taken both before and after said anneal. From the plots it can clearly be seen that the resistivity of the 0.5 weight percent copper structures are lower than that of the higher weight percent copper films. Additionally, it can also be seen that the annealed films of the four-layer structure have a lower resistivity than the annealed films of the three-layer structure.

The following Table II is a further comparison of the electromigration characteristics of sputtered Al-0.5% Cu metallurgy after annealing with intermetallic formation as compared to various other interconnect metallurgies.

TABLE II

| ALLOY | RESISTIVITY ($\mu\Omega$-cm) 1 hr, 400 C. Forming Gas | T(50%) 250 C., 2.5E + 06A/$cm^2$ (Hours) |
|---|---|---|
| Al-0.5% Cu (Ref.#1) | 3.5 | 9000 |
| Al-0.5% Cu (Ref.#2) | 3.4 | 12000 |
| Evap (Ref.#3) | 3.7 | 400–500 |
| Evap (Ref.#4) | 3.8 | 400–500 |
| Cr/Al-4% Cu | 3.0 | 400 |
| Al | 2.8 | 15 |
| Al-0.5% Cu | 2.9 | 50 |
| Al-1.2% Si-0.15% Ti | 3.1 | 23 |
| Al-1.2% Si (Ref.#5) | 2.9 | 156* |
| Al-1% Ti | 6.6 | 2 |
| Al—Si/Ti (Ref.#6) | 3.1 | 300* |

*150 C., 1E + 06 A/$cm^2$, unpassivated
1. Sputtered 4250Å Al-0.5% Cu/1500Å $TiAl_3$/4250Å Al-0.5% Cu and annealed in forming gas at 400° C.
2. Sputtered 700Å $TiAl_3$/8500Å Al-0.5% Cu/700Å $TiAl_3$/250Å Al-0.5% Cu and annealed in forming gas at 400° C.
3. Evaporated 4250Å Al-0.5% Cu/1500Å $TiAl_3$/4250Å Al-0.5% Cu and annealed in forming gas at 400° C.
4. Evaporate 700Å $TiAl_3$/8500Å Al-0.5% Cu/700Å $TiAl_3$/250 Al-0.5% Cu and annealed in forming gas at 400° C.
5. F. Fisher, Siemens Forsch-U. Entwickl-Dec. 13, 21 (1984).
6. D. S. Gardner, T. L. Michalka, P. A. Flinn, T. W. Barbee Jr., K. C. Saraswat & J. D. Meindl, Proc. 2nd IEEE VMIC, pp. 102–113 (1985).

From the table it can be seen that the sputtered 0.5% copper metallurgy provides the longest electro-migration capability with the lowest resistivity.

In general, while the corrosion resistance of bulk aluminum is greatly decreased by the addition of copper, it is known and recognized in the art (see, for example, J. Zahavi, M. Rotel, H. C. W. Huang, P. A. Totta, "Corrosion behavior of Al-Cu Alloy Thin Films in Microelectronics." Electrical Society Extended Abstracts, Vol. 84-2, Fall, 1984 that the corrosion resistance of reactive ion etched low copper containing films of aluminum (e.g., less than 1% copper) are at least as good as bulk aluminum. This is in contradiction to that skill in the art which recognizes that the corrosion resistance of higher percentage (above 1%) copper-aluminum films significantly degrades below that of pure aluminum. While detailed understanding of the mechanism of the performance of the subject interconnect metallurgy is not known, several principles have been extended by the inventors to explain the superior electromigration and resistivity results as seen above.

The solubility of copper and aluminum is known to decrease from 5.65 wt. % at 548° C. to 0.25 wt. % at room temperature. Therefore, the 0.5% copper film composition of the subject invention has enough copper without theta phase formation to improve both the mechanical properties and reliability, (e.g., electromigration properties) of the alloy over pure aluminum. Moreover, it is recognized that there is enhanced copper uniformity in the subject films due to the fact that said films were sputtered versus the non-uniformity in copper distribution as can be seen in the evaporated aluminum-copper films. In addition, it is also recognized that evaporation results in the uneven distribution of theta particles in the evaporated films which uneven distribution is known to contribute to the poor mechanical corrosion and electrical properties of the prior art films. The superior mechanical and electrical properties of the subject metallurgy is therefore directly attributed to the enhanced copper uniformity in these films as result of the deposition by sputtering. Therefore, an improved sputtered copper interconnect metallurgy has been developed that has enhanced reliability, lower resistivity, is dry etchable, and has a superior corrosion resistance than that metallurgy as presently used in the prior art. The preferred sputtered (4-layer) metallurgy exhibits lower resistivity and superior electromigration over a wider range of copper compositions than previous prior art structures.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A metallization structure for the interconnection of semiconductor devices on a substrate comprising:
    a) a layer of sputter deposited aluminum-copper of greater than 0.0% and less than 2.0% copper by weight; and
    b) an intermetallic layer formed at the surface of said aluminum-copper layer, said intermetallic formed of a sputter-deposited Group IVA metal and aluminum of said aluminum-copper layer.

2. A metallization structure according to claim 1 wherein said structure comprises:
    a) a first intermetallic layer;
    b) a layer of sputter deposited aluminum-copper containing greater than 0.0% and less than 2.0% copper by weight;
    c) a second intermetallic layer similar to (a) above deposited on layer (b) above; and
    d) a metal overlayer deposited on layer (c).

3. A metallization structure according to claim 2 wherein said metal overlayer is selected from the group comprising aluminum, aluminum-compounds or titanium-compounds.

4. A metallization structure according to claim 2 wherein said metal overlayer is aluminum-copper alloy containing greater than 0.0% to less than 2.0% copper by weight.

5. A metallization structure according to claim 2 wherein said intermetallic layer is approximately 700 Å thick.

6. A metallization structure according to claim 2 wherein said aluminum-copper layer is approximately 8,500 Å thick.

7. A metallization structure according to claim 2 wherein said metal overlayer is 100 Å–500 Å thick.

8. A metallization structure according to claim 2 wherein one metal of said intermetallic layer is selected from the group comprising the Group IVA metals of the Periodic Table.

9. A metallization structure according to claim 1 wherein said structure comprises:
    a) a first layer of sputter-deposited aluminum-copper containing greater than 0.0% and less than 2.0% copper by weight;
    b) an intermetallic layer deposited on layer (a) above;
    c) a second layer of the metallurgy of (a) above deposited on (b).

10. A metallization structure according to claim 9 wherein one metal of said intermetallic layer is selected from the group comprising the Group IVA metals of the Periodic Table.

11. A metallization structure according to claim 9 wherein the intermetallic layer is approximately 1500 Å thick.

12. A metallization structure according to claim 11 wherein the aluminum-copper layers are approximately 4,250 Å thick.

13. A metallization structure according to claim 1 wherein said structure comprises:
    a) a first layer of sputter deposited aluminum-copper containing 0.5% copper by weight approximately 4,250 Å thick,
    b) a layer of $TiAl_3$ deposited on layer (a) above and approximately 1500 Å thick, and
    c) a second layer of the metallurgy of (a) above deposited on (b).

14. A metallization structure according to claim 1 wherein said structure comprises:
    a) a first layer of $TiAl_3$ approximately 700 Å thick,
    b) a layer of sputter deposited aluminum copper containing 0.5% copper by weight deposited onto said $TiAl_3$ and being approximately 8,500 Å thick,
    c) a second layer of the metallurgy of (a) above deposited onto said layer onto (b) above, and
    d) a layer of sputter deposited aluminum copper containing 0.5% copper by weight deposited on layer (c) above and being approximately 250 Å thick.

15. A method of forming a structure for connecting semiconductor devices on a substrate comprising the steps of:
    a) sputter depositing a first layer of at least one of the Group IVA metals onto said substrate,
    b) sputter depositing onto said layer of the Group IVA metals a layer of aluminum copper of greater than 0.0% and less than 2.0% copper by weight,
    c) sputter depositing a second layer of the same Group IVA metal as in step a, and
    d) annealing the structure to form an intermetallic of the Group IVA metals and aluminum.

16. A method according to claim 15 wherein said annealed interconnect structure is patterned to connect the devices.

* * * * *